United States Patent
Kobayashi et al.

(10) Patent No.: US 9,070,728 B2
(45) Date of Patent: Jun. 30, 2015

(54) METHOD OF LOWERING TEMPERATURE OF SUBSTRATE TABLE, COMPUTER-READABLE STORAGE MEDIUM, AND SUBSTRATE PROCESSING SYSTEM

(75) Inventors: Kenichi Kobayashi, Nirasaki (JP); Youichi Nakayama, Nirasaki (JP); Kozo Kai, Fuchu (JP); Kenji Shirasaka, Fuchu (JP)

(73) Assignee: TOKYO ELECTRON LIMITED, Tokyo-To (JP)

( * ) Notice: Subject to any disclaimer, the term of this patent is extended or adjusted under 35 U.S.C. 154(b) by 1245 days.

(21) Appl. No.: 12/958,955

(22) Filed: Dec. 2, 2010

(65) Prior Publication Data

US 2011/0114298 A1 May 19, 2011

Related U.S. Application Data

(63) Continuation of application No. PCT/JP2009/066028, filed on Sep. 14, 2009.

(30) Foreign Application Priority Data

Sep. 16, 2008 (JP) .................................. 2008-236340

(51) Int. Cl.
*F28F 7/00* (2006.01)
*H01L 21/677* (2006.01)
(Continued)

(52) U.S. Cl.
CPC .......... *H01L 21/67745* (2013.01); *C23C 16/46* (2013.01); *H01L 21/67103* (2013.01); *H01L 21/67109* (2013.01)

(58) Field of Classification Search
USPC ................................ 432/77, 78, 80; 165/185
See application file for complete search history.

(56) References Cited

U.S. PATENT DOCUMENTS 6,338,626 B1   1/2002   Saeki
2001/0013515 A1*  8/2001   Harada et al. ................. 219/390
(Continued)

FOREIGN PATENT DOCUMENTS

| JP | 11-87467 | 3/1999 | |
|---|---|---|---|
| JP | 2005-259858 | 9/2005 | |
| JP | 2005259858 A * | 9/2005 | .............. H01L 21/68 |
| JP | 2008-1923 | 1/2008 | |

OTHER PUBLICATIONS

International Search Report for International Application No. PCT/JP2009/066028 mailed Nov. 17, 2009.
(Continued)

*Primary Examiner* — Steven B McAllister
*Assistant Examiner* — Ko-Wei Lin
(74) *Attorney, Agent, or Firm* — Smith, Gambrell & Russell LLP

(57) ABSTRACT

A method of lowering a temperature of a substrate table uses a substrate W processing system including a first substrate table 2b; one or more processing chambers 1b, in each of which the first substrate table 2b is disposed, the processing chamber being configured to perform a predetermined process, with the substrate being placed on the first substrate table 2b; a substrate transfer apparatus 31 configured to transfer the substrate to the processing chamber 1b; a transfer chamber in which the substrate transfer apparatus 31 is disposed; and a second substrate table configured to cool the substrate. The method of lowering a temperature of a substrate table comprises the steps of first transfer in which the substrate W placed on the first substrate table 2b is transferred to the second substrate table by the substrate transfer apparatus 31, and second transfer in which the substrate placed on the second substrate table is transferred to the first substrate table 2b. By repeating the step of first transfer and the step of second transfer, a heat of the first substrate table 2b is absorbed by the substrate W placed on the first substrate table 2b, so that a temperature of the first substrate table 2b is lowered.

15 Claims, 8 Drawing Sheets

(51) Int. Cl.
*C23C 16/46* (2006.01)
*H01L 21/67* (2006.01)

(56) References Cited

U.S. PATENT DOCUMENTS

2006/0127067 A1* 6/2006 Wintenberger et al. ...... 392/416
2007/0209699 A1* 9/2007 Sichanugrist et al. ........ 136/261

OTHER PUBLICATIONS

International Publication WO 2010/032708 A1 (cover sheet).
International PCT Request Form (6 pages).
PCT Notification of Receipt of Record Copy (Form PCT/IB/301).
PCT Notification Concerning Submission or Transmittal of Priority Document (Form PCT/IB/304).

* cited by examiner

METHOD OF LOWERING TEMPERATURE OF SUBSTRATE TABLE, COMPUTER-READABLE STORAGE MEDIUM, AND SUBSTRATE PROCESSING SYSTEM

CROSS REFERENCE TO RELATED APPLICATION

This application is a continuation of PCT/JP2009/066028, filed Sep. 14, 2009 and claims priority therefrom as well as priority from JP2008-236340 filed Sep. 16, 2008. Each of PCT/JP2009/066028 and JP2008-236340 is incorporated by reference herein.

FIELD OF THE INVENTION

The present invention relates to a method of lowering a temperature of a substrate table for placing thereon a substrate such as a semiconductor wafer, when a film deposition process, for example, is performed to the substrate, a computer-readable storage medium used in the method, and a substrate processing system configured to perform the method.

BACKGROUND ART

A processing apparatus, which is configured to carry out a film deposition process to a substrate such as a semiconductor wafer in the course of manufacturing a semiconductor device, includes a substrate table for placing thereon the substrate in a chamber. The substrate is processed while the substrate is supported by the substrate table. In order to heat the substrate depending on process conditions, the substrate table incorporates a heater. For example, when a film deposition process by a plasma CVD method is carried out, a temperature of the substrate table is heated by the heater to about 600° C. to 700° C. (for example, JP2008-1923A).

In the film deposition apparatus, when an inside of the chamber is cleaned, or the chamber is opened to an atmosphere for maintenance, it is necessary to lower the temperature of the substrate table from the process temperature to about a room temperature. In order not to damage the substrate table by a sudden temperature change, the temperature of the substrate table is gradually lowered for several hours by an indirect method, i.e., a gas cooling method that introduces a cooling gas into the chamber. However, since it takes a long time for the gas cooling method to lower the temperature, a downtime of the apparatus increases, which invites decrease in a working rate.

DISCLOSURE OF THE INVENTION

The present invention has been made in view of the above circumstances. The object of the present invention is to provide a method capable of improving the efficiency of lowering a temperature of a substrate table, and of reducing the time required for lowering the temperature.

In order to achieve the above object, a method of lowering a temperature of a substrate table in accordance with the first aspect of the present invention is a method of lowering a temperature of a substrate table that uses a substrate processing system including: a first substrate table provided with a heating mechanism for heating a substrate; one or more processing chambers, in each of which the first substrate table is disposed, the processing chamber being configured to perform a predetermined process, with the substrate being placed on the first substrate table; a substrate transfer apparatus configured to transfer the substrate to the processing chamber; a transfer chamber in which the substrate transfer apparatus is disposed; and a second substrate table configured to cool the substrate;

the method of lowering a temperature of a substrate table comprising the steps of:

first transfer in which the substrate placed on the first substrate table is transferred to the second substrate table by the substrate transfer apparatus; and second transfer in which the substrate placed on the second substrate table is transferred to the first substrate table by the substrate transfer apparatus;

wherein, by repeating the step of first transfer and the step of second transfer, a heat of the first substrate table is absorbed by the substrate placed on the first substrate table, and a temperature of the first substrate table is lowered.

According to the method of lowering a temperature of a substrate table of the present invention, by repeating the transfer of the substrate between the first substrate table and the second substrate table, the temperature of the first substrate table to be cooled can be transmitted to the second substrate table for cooling a substrate, whereby the temperature of the first substrate table can be effectively lowered at a suitable temperature lowering rate. As compared with a case where the first substrate table is equipped with a cooling mechanism, the use of a substrate as a heat medium can simplify the equipment. In addition, since the time required for lowering the temperature can be reduced, the downtime of the apparatus can be reduced so as to improve a working efficiency.

The method of lowering a temperature of a substrate table of the present invention may further comprise a step of cooling in which the substrate placed on the second substrate is cooled by a cooling mechanism provided with the second substrate table. According to this feature, since the second substrate table is equipped with the cooling mechanism, the substrate cooling effect can be enhanced, whereby the effect of lowering the temperature of the first substrate table can be improved so that the time required for lowering the temperature can be reduced.

In the method of lowering a temperature of a substrate table of the present invention, the substrate processing system may further include a load-lock chamber as a vacuum preparation chamber, in which a table is disposed, the load-lock chamber being disposed adjacently to the transfer chamber, and the table in the load-lock chamber serves also as the second substrate table. According to this feature, since the table in the load-lock chamber can be used as the second substrate table for cooling a substrate, another equipment exclusively used therefor is dispensable. Thus, the present method can be directly applied to an existing equipment.

In the method of lowering a temperature of a substrate table of the present invention, the second substrate table may be disposed in the transfer chamber. According to this feature, since the second substrate table for cooling a substrate is disposed in the transfer chamber, the time required for alternately transfer the substrate can be reduced. Thus, a throughput of the temperature lowering process of the first table can be improved.

In the method of lowering a temperature of a substrate table of the present invention, the substrate processing system may further include a substrate cooling chamber for cooling the substrate, and the second substrate table may be disposed in the substrate cooling chamber. According to this feature, since the second substrate table is disposed in the exclusive substrate cooling chamber and the temperature lowering process is performed, the substrate cooling effect can be enhanced, whereby the effect of lowering the temperature of the first substrate table can be improved so that the time required for lowering the temperature can be reduced.

The method of lowering a temperature of a substrate table of the present invention may further comprise the steps of: first lowering temperature in which the temperature of the first substrate table is lowered in a predetermined temperature zone at a rate that is controlled to be constant; and second lowering temperature in which the temperature of the first substrate is naturally lowered in a temperature zone that is lower than the predetermined temperature zone; wherein the step of first transfer and the step of second transfer are performed only during the step of second lowering temperature. According to this feature, since the step of first transfer and the step of second transfer are applied to only the second temperature lowering phase that performs a natural temperature lowering, the temperature lowering rate in the second temperature lowering phase can be increased, whereby the total time for lowering the temperature can be reduced.

In the method of lowering a temperature of a substrate table of the present invention, the step of first transfer and the step of second transfer may be performed when the processing chamber and the transfer chamber are under vacuum. According to this feature, in a substrate processing system configured to perform a process under vacuum conditions, such as a plasma process, the temperature lowering process can be performed without opening to an atmosphere, which is advantageous.

In the method of lowering a temperature of a substrate table of the present invention, the substrate may be formed of an exclusive temperature lowering substrate of a heat release structure, with a plurality of ridges being formed on an upper surface thereof. According to this feature, since the exclusive temperature lowering substrate is used as a heat medium, the heat absorption and the heat release effect can be enhanced. Thus, a throughput of the temperature lowering process can be improved.

A computer-readable storage medium in accordance with the second aspect of the present invention is a computer-readable storage medium storing a control program executable on a computer, the control program being configured to control a substrate processing system so as to carry out a method of lowering a temperature of a substrate table by the computer, the substrate processing system including: a first substrate table provided with a heating mechanism for heating a substrate; one or more processing chambers, in each of which the first substrate table is disposed, the processing chamber being configured to perform a predetermined process, with the substrate being placed on the first substrate table; a substrate transfer apparatus configured to transfer the substrate to the processing chamber; a transfer chamber in which the substrate transfer apparatus is disposed; and a second substrate table configured to cool the substrate;

the method of lowering a temperature of a substrate table comprising the steps of:

first transfer in which the substrate placed on the first substrate table is transferred to the second substrate table by the substrate transfer apparatus; and second transfer in which the substrate placed on the second substrate table is transferred to the first substrate table by the substrate transfer apparatus;

wherein, by repeating the step of first transfer and the step of second transfer, a heat of the first substrate table is absorbed by the substrate placed on the first substrate table, and a temperature of the first substrate table is lowered.

A substrate processing system in accordance with the third aspect of the present invention is a substrate processing system comprising:

a first substrate table provided with a heating mechanism for heating a substrate;

one or more processing chambers, in each of which the first substrate table is disposed, the processing chamber being configured to perform a predetermined process, with the substrate being placed on the first substrate table;

a substrate transfer apparatus configured to transfer the substrate to the processing chamber;

a transfer chamber in which the substrate transfer apparatus is disposed; and a control part configured to control the substrate transfer apparatus;

wherein the control part causes the substrate transfer apparatus to repeat transfer of the substrate placed on the first substrate table to a second substrate table, and transfer of the substrate placed on the second substrate table to the first substrate table, whereby a heat of the first substrate table is absorbed by the substrate placed on the first substrate table, and a temperature of the first substrate table is lowered.

According to the present invention, since the temperature lowering rate of the substrate table can be improved, while avoiding a damage to the substrate table in the processing chamber, the time required for lowering the temperature can be reduced, whereby a downtime of the apparatus can be reduced.

EMBODIMENT FOR CARRYING OUT THE INVENTION

First Embodiment

Figure 1:
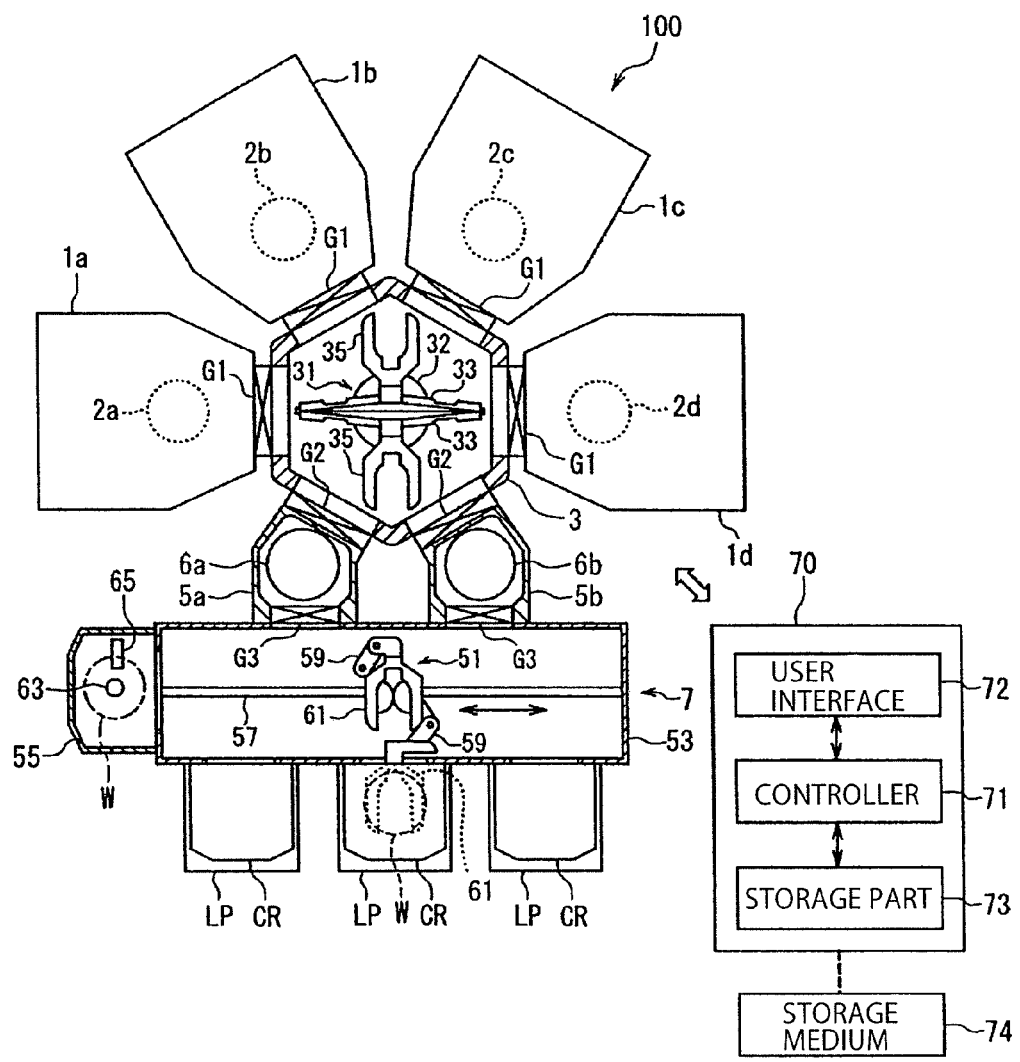
FIG. 1 is a schematic structural view of a substrate processing system.

Embodiments of the present invention will be described in detail below with reference to the drawings. Firstly, a substrate processing system in an embodiment of the present invention is described with reference to FIGS. 1 and 2. FIG. 1 is a schematic structural view showing a substrate processing system 100 configured to perform various processes, such as a film deposition process and an etching process, to a semiconductor wafer (hereinafter referred to simply as "wafer") W as a substrate, for example.

Figure 2:
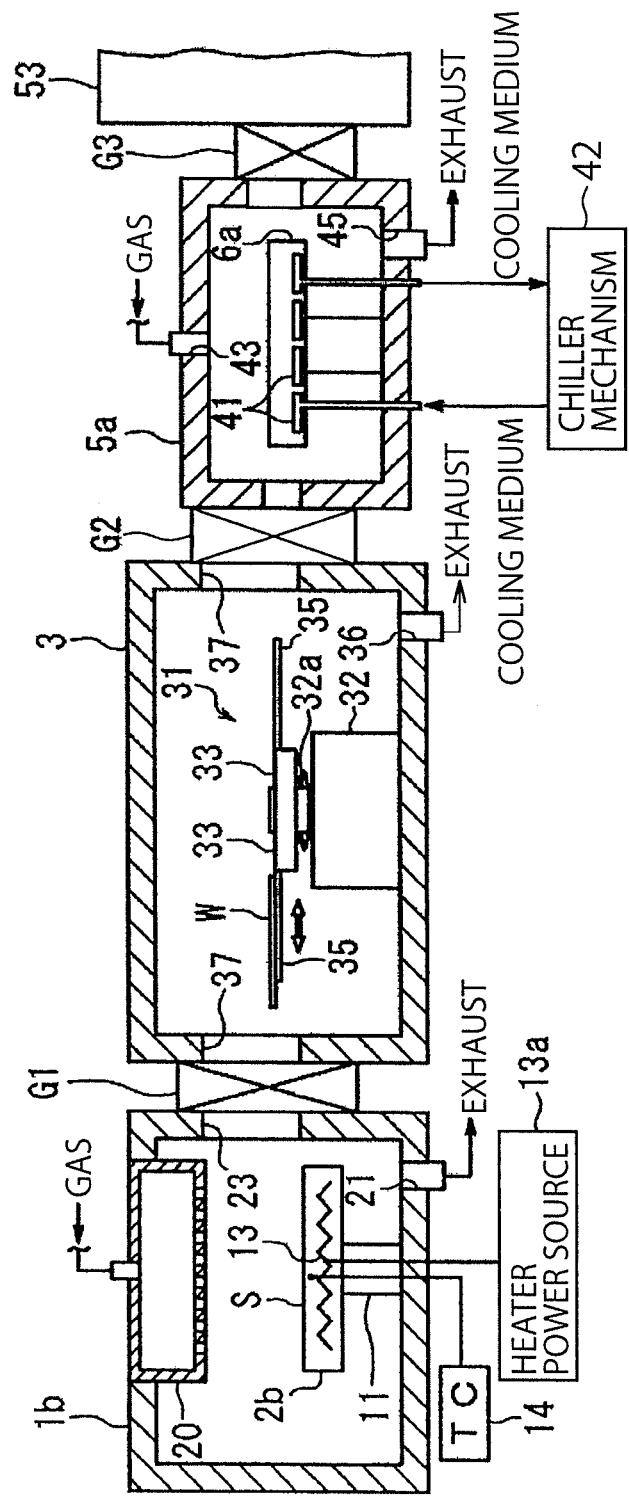
FIG. 2 is a sectional view showing an inside structure of a main part of the substrate processing system.

FIG. 2 is a sectional view showing insides of a main part of respective vacuum-side chambers (i.e., load-lock chambers 5a and 5b, a transfer chamber 3, and processing chambers 1a to 1d) of the substrate processing system 100. FIG. 2 shows the insides of the load-lock chamber 5a, the processing chamber 1b, and transfer chamber 3 as representatives.

The substrate processing system 100 is constituted as a cluster tool of a multi-chamber structure. The substrate processing system 100 mainly includes: the four processing chambers 1a, 1b, 1c and 1d configured to perform various processes to a wafer W; the vacuum-side transfer chamber 3 connected to the processing chambers 1a to 1d via gate valves G1, G1, G1 and G1; the two load-lock chambers 5a and 5b connected to the vacuum-side transfer chamber 3 via gate valves G2 and G2; and a loader unit 7 connected to the two load-lock chambers 5a and 5b via gate valves G3 and G3.

The four processing chambers 1a to 1d are processing apparatuses configured to subject a wafer W to a process, such as a CVD process, an etching process, an ashing process, a modification process, an oxidation process and a diffusion process. The processing chambers 1a to 1d may carry out a process of the same kind to a wafer W, or processes of different kinds to a wafer W. In the respective processing chambers 1a to 1d, processing stages 2a, 2b, 2c and 2d as "first substrate tables" for placing thereon wafers W are disposed, respectively.

For example, the processing chamber 1b for performing a CVD is hermetically sealable. Inside the processing chamber 1b, there is provided the processing stage 2b for horizontally placing thereon a wafer W. As shown in FIG. 2, the processing stage 2b is disposed such that the processing stage 2b is supported by a cylindrical support member 11. A resistance heater (heating mechanism) 13 is embedded in the processing stage 2b. When the resistance heater 13 is fed by a heater power source 13a, not shown, the resistance heater heats a wafer W placed on the processing stage 2b to a predetermined temperature. As a heating method, a lamp heating method may be employed, for example. In addition, the processing stage 2b is provided with a thermocouple (TC) 14 so as to measure the temperature of the processing stage 2b in real time.

Although not shown, the processing stage 2b has a plurality of support pins for elevating and lowering a wafer W while supporting the same, such that the support pins are projectable and retractable with respect to a table surface S of the processing stage 2b. These support pins are displaced upward and downward by a given elevating mechanism. At an elevated position, a wafer W can be transferred to or from the vacuum-side transfer apparatus 31 (described below).

As shown in FIG. 2, a showerhead 20 is disposed on a ceiling part of the processing chamber 1b. The showerhead 20 is connected to a gas supply source, not shown, so that a process gas, a cleaning gas, a cooling and so on can be introduced into the processing chamber 1b. The gas introduced into the processing chamber 1b can be discharged outside the processing chamber 1b from an outlet port 21 connected to a vacuum pump, not shown.

Formed in a sidewall of the processing chamber 1b is a loading/unloading port 23 for loading and unloading a wafer W to and from the vacuum-side transfer chamber 3. By opening and closing a gate valve G1, a wafer W is loaded and unloaded through the loading/unloading port 23.

The vacuum-side transfer chamber 3 capable of being vacuumized is provided with a vacuum-side transfer apparatus 31 as a first transfer apparatus configured to transfer a wafer W to the processing chambers 1a to 1d and the load-lock chambers 5a and 5b (see, FIG. 2). The vacuum-side transfer apparatus 31 includes a base 32, and a pair of opposed transfer arm parts 33 and 33 connected to the base 32. Each of the transfer arm parts 33 and 33 is structured such that the transfer arm part 33 is extendable and turnable about a common rotational shaft 32a. On ends of the respective transfer arm parts 33 and 33, there are disposed forks 35 and 35 as holding members for holding thereon wafers W. The vacuum-side transfer apparatus 31 transfers a wafer W among the processing chambers 1a to 1d, or between the processing chambers 1a to 1d and the load-lock chambers 5a and 5b, with the wafer W being placed on each fork 35. Formed in a bottom part of the vacuum-side transfer chamber 3 is an outlet port 36 for reducing a pressure in the vacuum-side transfer chamber 3 and exhausting the same. The outlet port is connected to a vacuum pump, not shown. Loading/unloading ports 37 are formed in a side part of the vacuum-side transfer chamber 3 at positions corresponding to the surrounding processing chambers 1a to 1d and the load-lock chambers 5a and 5b. With the gate valves G1 and G2 being opened, a wafer W is loaded and unloaded through each loading/unloading port 37.

The load-lock chambers 5a and 5b are vacuum preparation chambers through which a wafer W is transferred between the vacuum-side transfer chamber 3 and an atmospheric-side transfer chamber 53 (described below). Thus, conditions of the load-lock chambers 5a and 5b can be switched between a vacuum condition and an atmospheric pressure condition. In the load-lock chambers 5a and 5b, there are respectively disposed waiting stages 6a and 6b for placing thereon wafers W. A wafer W is transferred between the vacuum-side transfer chamber 3 and the atmospheric-side transfer chamber 53 via the waiting stages 6a and 6b. In this embodiment, the waiting stage 6a (or waiting stage 6b) is used as the "second substrate table" for cooling.

The waiting stage 6a in the load-lock chamber 5a is equipped with a chiller mechanism (cooling mechanism) 42 as cooling means for cooling a wafer W. The chiller mechanism 42 circulates a cooling medium through a flow channel 41 formed in the waiting stage 6a, for example. The load-lock chamber 5a has an inlet port 43 and an outlet port 45 for a cooling gas, so that when a wafer W is placed on the waiting stage 6a, the wafer W can be cooled. A thermocouple may be provided on the waiting stage 6a according to need, so as to measure a temperature of the waiting stage 6a in real time. The inside of the load-lock chamber 5b has the same structure as that of the load-lock chamber 5a.

The loader unit 7 includes the transfer chamber 53 under an atmospheric pressure condition, three load ports LP disposed adjacently to the transfer chamber 53, and an orienter 55 disposed adjacently to another side surface of the transfer chamber 53. The orienter 55 is a position measuring apparatus configured to measure a position of a wafer W. In the transfer chamber 53, an atmospheric-side transfer apparatus 51 as a second substrate transfer apparatus is disposed.

The transfer chamber 53 under the atmospheric pressure condition has a rectangular shape in plan view, and has an equipment (not shown) for circulating nitrogen gas and cleaning air, for example. A guide rail 57 is disposed along a longitudinal direction of the transfer chamber 53. The atmospheric-side transfer apparatus 51 is slidably supported by the guide rail 57. Namely, the atmospheric-side transfer apparatus 51 is configured to be movable in a direction shown by the arrows in FIG. 1 along the guide rail 57 by a drive mechanism, not shown. The atmospheric-side transfer apparatus 51 includes a pair of transfer arm parts 59 and 59 arranged at an upper level and a lower level, respectively. The respective transfer arm parts 59 and 59 are extendable and turnable. Disposed on ends of the respective transfer arm parts 59 and 59 are forks 61 and 61 as holding members for holding thereon wafers W. The atmospheric-side transfer apparatus 51 transfers a wafer W among transfer cassettes CR on the load ports LP, the load-lock chambers 5a and 5b, and the orienter 55, with the wafer W being placed on each fork 61.

The load port LP is capable of placing thereon the wafer cassette CR. The wafer cassette CR is configured to contain a plurality of wafers W with equal intervals therebetween at multiple levels.

The orienter 55 includes a rotational plate 63 rotated by a drive motor, not shown, and an optical sensor 65 disposed on an outer peripheral position of the rotational plate 63, for detecting a peripheral part of a wafer W. While the rotational plate 63 placing thereon the wafer W being rotated, the optical sensor 65 radiates a strip-like laser beam toward a peripheral part of a wafer W from a light source (not shown). Then, the optical sensor 65 detects the laser beam partially blocked by the wafer W by a detecting part (not shown). Based on the detection result of the laser beam, an eccentric amount and an eccentric direction of the wafer W with respect to a center of the rotational plate 63 are calculated. In addition, the optical sensor 65 can detect an orientation of the wafer W and change the orientation of the wafer W to a predetermined orientation, by recognizing a cutout (notch or orientation flat) formed in the rotating wafer W. The atmospheric-side transfer apparatus 51 receives the wafer W on the rotational plate 63 by the fork 61, such that the eccentric amount and the eccentric direction calculated by the optical sensor 65 are corrected.

The respective components of the substrate processing system 100 are connected to a control device 70 so as to be controlled by the same. The control device 70 includes a controller 71 having a CPU, a user interface 72 connected to the controller 71, and a storage part 73. The controller 71 totally controls the processing chambers 1a to 1d, the vacuum-side transfer apparatus 31, the atmospheric-side transfer apparatus 51 in the substrate processing system 100, for example.

The user interface 72 has a keyboard or a touch panel by which a step manager can input commands for managing the substrate processing system 100, and a display for visualizing a working state of the substrate processing system 100. The storage part 73 stores a control program (software) for realizing various processes performed by the substrate processing system 100 under the control of the controller 71, and recipes recording process condition data etc. Based on an instruction from the user interface 72, a given control program and a recipe are called from the storage part 73 and executed by the controller 71 according to need. Thus, under the control of the controller 71, a desired process can be carried out in the processing chambers 1a to 1d of the substrate processing system 100, and a predetermined substrate transfer operation can be carried out in the substrate processing system 100. The control program and the recipes such as process condition data can be utilized by installing a program or recipes stored in a computer-readable storage medium 74 in the storage part 73. As the computer-readable storage medium 74, a CD-ROM, a hard disc, a flexible disc, a flash memory, and a DVD can be used, for example. It is also possible to use the recipes which are occasionally transmitted from another apparatus through a leased line, for example.

In the substrate processing system 100 as structured above, one wafer W is taken out from the wafer cassette CR, and is then oriented by the orienter 55. Thereafter, the wafer W is loaded into one of the load-lock chamber 5a and 5b, and is placed on the waiting stage 6a or 6b. Then, the wafer W in the load-lock chamber 5a is transferred to one of the processing chambers 1a to 1d, and placed on one of the processing stages 2a to 2d, by the vacuum-side transfer apparatus 31. For example, in the processing chamber 1b where the wafer W is placed on the processing stage 2b, a material gas is supplied from the showerhead 20 toward the wafer W, while the wafer W is heated by the resistance heater 13 under vacuum conditions. As a result, a predetermined thin film such as a Ti film or a TiN film can be deposited on the surface of the wafer W by a CVD method. After the film deposition process, the wafer W is returned to the wafer cassette CR in accordance with a procedure reverse to the above, whereby the process to the one wafer W is finished.

Figure 3:
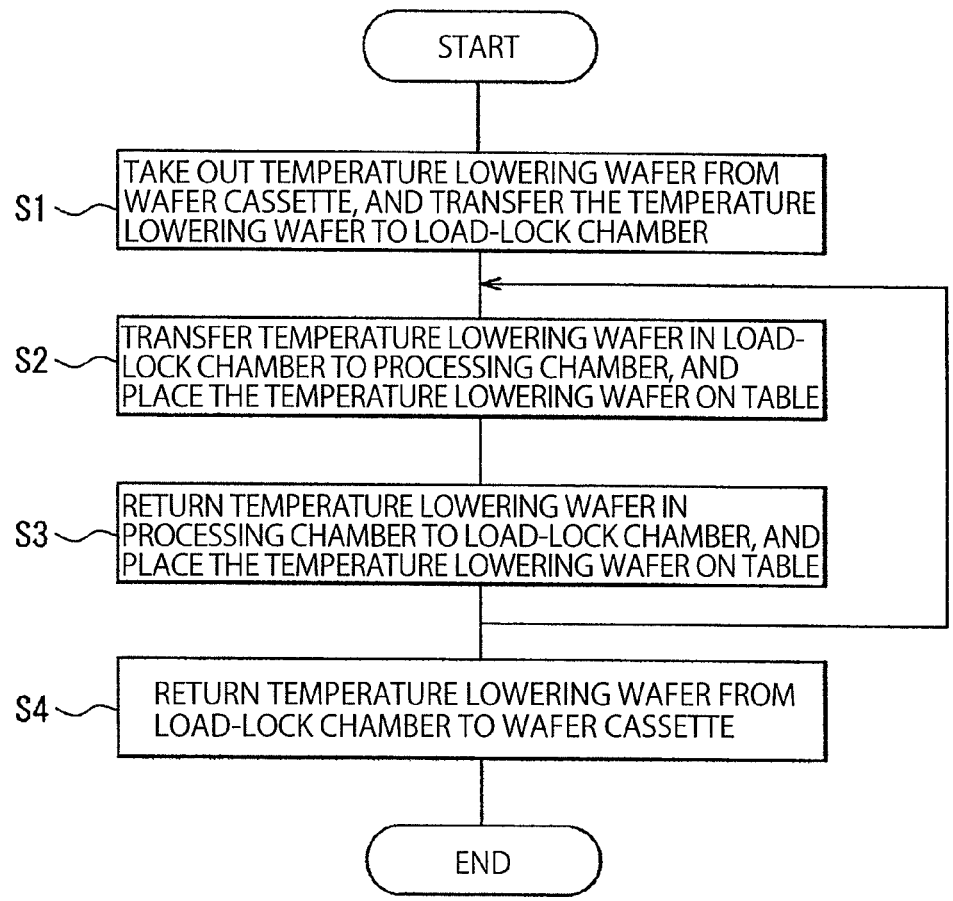
FIG. 3 is a flowchart showing a procedure of a method of lowering a temperature of a table in a first embodiment.
Figure 4:
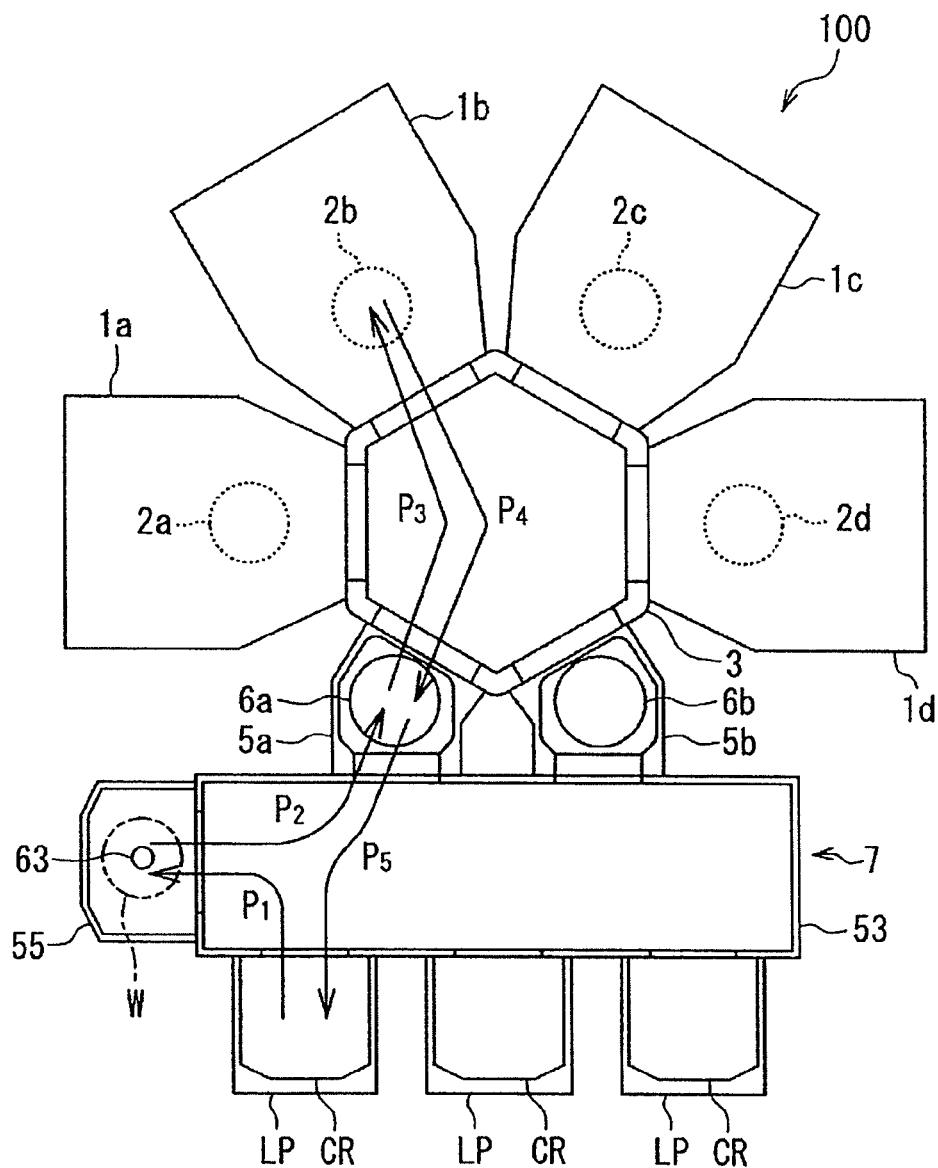
FIG. 4 is an explanatory view showing a transfer path of a wafer in the first embodiment.

Next, there is described a method of lowering a temperature of a substrate table in the first embodiment of the present invention, which is performed in the substrate processing system 100 having the aforementioned structure. Herein, there is described a case where a temperature of the processing stage 2b of the processing chamber 1b is lowered, for example. FIG. 3 is a flowchart schematically showing a procedure of the method of lowering a temperature of a substrate table in a first embodiment. FIG. 4 shows a transfer path of a wafer W when the present method is carried out. At first, in the step S1 of FIG. 3, one wafer W to be used for a temperature lowering process is taken out from the wafer cassette CR by the atmospheric-side transfer apparatus 51, and is then oriented by the orienter 55, thereafter, the wafer W is loaded into the load-lock chamber 5a and placed on the waiting stage 6a, for example (paths $P_1$ and $P_2$ in FIG. 4). A temperature of the waiting stage 6a in the load-lock chamber 5a is set at a predetermined temperature $T_1$, by a cooling gas introduced thereinto and the chiller mechanism 42. Thus, the wafer W is cooled on the stage 6a for a predetermined time. However, when the wafer W taken out from the wafer cassette CR has a sufficiently low temperature, the first cooling operation on the waiting stage 6a can be omitted.

Then, in the step S2, the wafer W, which has been placed on the waiting stage 6a in the load-lock chamber 5a and cooled to about the temperature $T_1$, is transferred to the processing chamber 1b and placed on the processing stage 2b by the vacuum-side transfer apparatus 31 (path $P_3$ in FIG. 4) (a step of second transfer). Since a cooling gas is introduced from the showerhead 20 into the processing chamber 1b, and a heat of the processing stage 2b is absorbed by the wafer W placed on the processing stage 2b, lowering of temperature of the processing stage 2b is promoted.

After a predetermined time has passed, in the step S3, the wafer W placed on the processing stage 2b in the processing chamber 1b is returned again to the load-lock chamber 5a and placed on the waiting stage 6a by the vacuum-side transfer apparatus 31 (path $P_4$ in FIG. 4) (a step of first transfer). The wafer W, which is warmed by absorbing the heat of the processing stage 2b of the processing chamber 1b, is cooled to about the temperature $T_1$ in the load-lock chamber 5a.

In the method of lowering a temperature of a substrate table in this embodiment, by repeating plural times the above step S2 and the step S3 (transfer of a wafer along the path $P_3$ and transfer of the wafer along the path $P_4$), which are one cycle, a temperature lowering rate of the processing stage 2b of the processing chamber 1b can be increased. Since the temperature of the processing stage 2b can be measured in real time by the thermocouple 14, the step S2 and the step S3 are repeated for the required number of times until the temperature of the processing stage 2b reaches a predetermined temperature.

After the temperature of the processing stage 2b has been lowered to the predetermined temperature, in the step S4, the wafer W is returned from the load-lock chamber 5a to the wafer cassette CR by the atmospheric-side transfer apparatus 51 in accordance with a procedure reverse to the above (path $P_5$).

As described above, in this embodiment, repeating of the step of first transfer and the step of second transfer can be performed, while the processing chamber 1b and the load-lock chamber 5a can be maintained under vacuum conditions. Namely, the operations for repeatedly transfer the wafer W between the load-lock chamber 5a and the processing chamber 1b can be carried out under vacuum conditions, which is advantageous. In addition, since a wafer W is used as a heat medium, a temperature lowering rate can not be excessively increased but can be appropriately maintained. The temperature lowering rate of the processing stage 2b can be adjusted by changing a cycle time in which the wafer W is repeatedly transferred between the load-lock chamber 5a and the processing chamber 1b, and/or by changing a set temperature of the waiting stage 6a in the load-lock chamber 5a (temperature difference between the waiting stage 6a and the processing stage 2b).

In the above description, although the process is performed by one wafer W, which is explained by way of example, two or more wafers W can be simultaneously used. For example, while one wafer W is placed on the processing stage 2b of the processing chamber 1b so as to absorb a heat of the processing stage 2b, the other wafer W can be placed on the waiting stage 6a in the load-lock chamber 5a so as to be cooled. In this case, by continuously performing the operation for unloading the one wafer W from the processing chamber 1b and the operation for loading the other wafer to the processing chamber 1b, the cycle time for repeating the steps S2 and S3 can be reduced, whereby the time required for lowering the temperature of the processing stage 2b of the processing chamber 1b can be reduced. Further, one of the processing stages 2a, 2c and 2d, or all the processing stages 2a, 2c and 2d, of the other processing chambers 1a, 1c and 1d can be simultaneously subjected to the temperature lowering process. Furthermore, it is possible to perform the temperature lowering operation by using both the load-lock chamber 5b and the load-lock chamber 5a at the same time.

In addition, simultaneously with the temperature lowering process in the processing chamber 1b, it is possible to perform an ordinary process, such as a plasma CVD, to another wafer W taken out from the wafer cassette CR, in another processing chamber 1a, 1c or 1d.

Herein, a temperature of the processing stage 2b whose temperature is to be lowered in the processing chamber 1b is referred to as $T_2$. In this case, in order that a temperature difference between the temperature $T_2$ and the temperature $T_1$ of the waiting stage 6a in the load-lock chamber 5a is within a predetermined range, such as 10 to 700° C., it is possible to adjust the temperature $T_1$ of the waiting stage 6a by a cooling gas in the load-lock chamber 5a and the chiller mechanism 42. Namely, by adjusting the temperature $T_1$ depending on the temperature $T_2$ which is lowered by the temperature lowering process, the temperature difference between $T_2 - T_1$ is controlled to be constant. By controlling the temperature difference $T_2 - T_1$ to be constant, deformation such as distortion of the wafer W can be prevented, which might be caused by the too large temperature difference when the wafer W is transferred from the processing stage 2b to the waiting stage 6a, and impairment of the temperature lowering effect can be prevented, which is caused by the too small temperature difference. Thus, the temperature lowering effect (i.e., a heat conductive efficiency from the processing stage 2b to the waiting stage 6a through the wafer W) provided by the wafer W can be maximized, while maintaining the suitable temperature difference.

Figure 5:
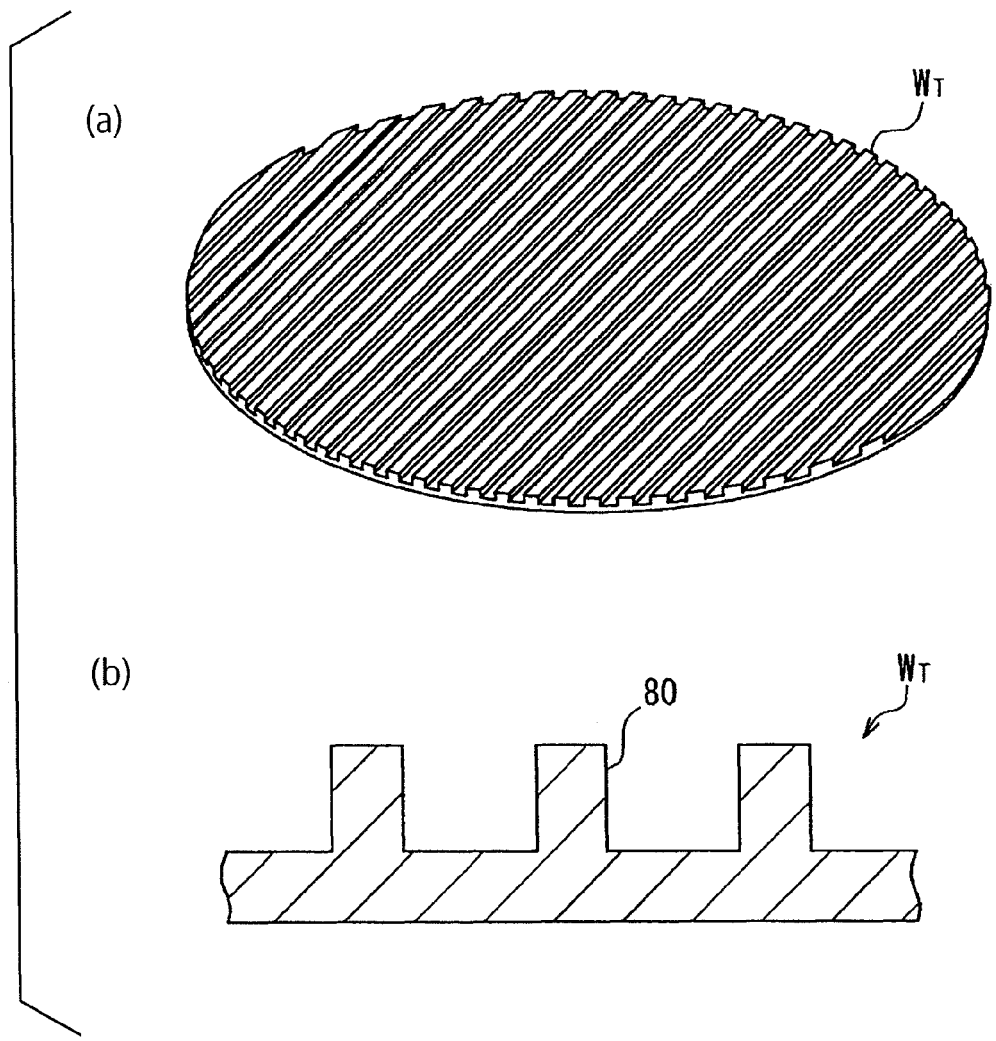
FIG. 5(a) is a perspective view of an appearance of an exclusive temperature lowering wafer.
FIG. 5(b) is a sectional view of a main part thereof.

As a wafer W used as a heat medium in the temperature lowering process, a semiconductor wafer generally used in a manufacture of a semiconductor device may used, and an exclusive temperature lowering wafer, which is designed to be suitable for carrying out the present method, may be used. In this embodiment, the exclusive temperature lowering wafer whose surface area is larger than that of the general wafer W is preferably used. FIGS. 5(a) and 5(b) show an example of the exclusive temperature lowering wafer $W_T$. The wafer $W_T$ has a plurality of ridges (fin structures) 80 on an upper surface thereof. Therefore, the wafer $W_T$ has a large surface area, and a heat release structure excellent in releasing heat. A lower surface of the exclusive temperature lowering wafer $W_T$ has a flat shape. Therefore, a contact area between the wafer $W_T$ and a substrate table is large, which facilitates a heat conductivity therebetween. Thus, immediately after the exclusive temperature lowering wafer $W_T$ is placed on the processing stage 2b, the exclusive temperature lowering wafer $W_T$ absorbs the heat of the processing stage 2b. In addition, the heat can be easily released from the upper surface (ridges 80) of a large surface area. When the exclusive temperature lowering wafer $W_T$ is placed on the waiting stage 6a in the load-lock chamber 5a, since the heat can be easily conducted to the waiting stage 6a and the heat can be released from the upper surface of a large surface area, the wafer $W_T$ can be quickly cooled. As a material of the exclusive temperature lowering wafer $W_T$, such a material that has a large heat conductivity and is resistive to generation of particles is preferred. As such a material, a metal material such as aluminum, a carbon material, and a ceramic material such as SiC, AlN, $Al_2O_3$ may be taken by way of example.

In this embodiment, it is not necessary to perform the temperature lowering process in all over the temperature zone of the processing stage 2b whose temperature is to be lowered, and it is possible to perform the temperature lowering process only in a part of the zone. As described in the following example, at an initial phase of the temperature lowering process, a temperature lowering rate is large even when a temperature is naturally lowered. Thus, there is a possibility that the substrate table might be damaged by a sudden temperature lowering. In order to prevent this, it is preferable that a control operation is carried out by a software, such that the temperature is lowered at a constant rate, by using the resistance heater 13. Under such a control, there is little advantage in performing the temperature lowering process using a wafer W as a heat medium. Thus, in this case, the temperature lowering process in this embodiment is preferably applied to a low temperature zone in which the temperature control by the resistance heater 13 is not carried out.

Second Embodiment

Next, the method of lowering a temperature of a substrate table in a second embodiment of the present invention is described with reference to FIG. 6. In the first embodiment, a wafer W is transferred between the processing stage 2b of the processing chamber 1b and the waiting stage 6a in the load-lock chamber 5a. However, in this embodiment, a wafer cooling stage 39 as the "second substrate table" for cooling a wafer W is disposed in the transfer chamber 3, and a wafer W is transferred between the processing stage 2b of the processing chamber 1b and the wafer cooling stage 39. The procedure is described below.

Figure 6:
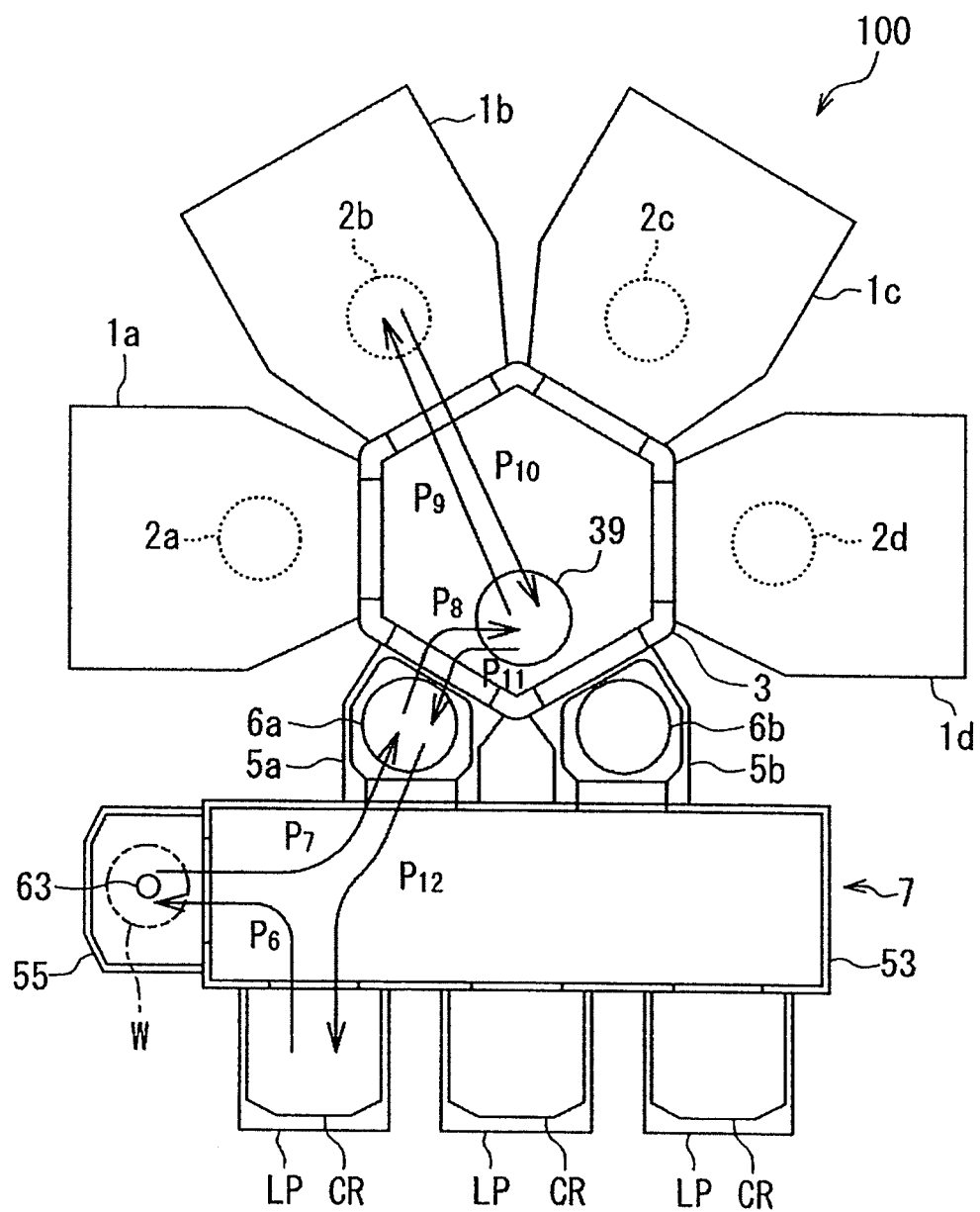
FIG. 6 is an explanatory view showing a transfer path of a wafer in a second embodiment.

At first, one wafer W to be used for the temperature lowering process is taken out from the wafer cassette CR by the atmospheric-side transfer apparatus 51, and is then oriented by the orienter 55, thereafter, the wafer W is loaded into the load-lock chamber 5a and placed on the waiting stage 6a, for example (paths $P_6$ and $P_7$ in FIG. 6).

Then, the wafer W is transferred from the load-lock chamber 5a to the wafer cooling stage 39 of the transfer chamber 3 by the vacuum-side transfer apparatus 31 (path $P_8$ in FIG. 6). The wafer cooling stage 39 is equipped with a chiller mechanism, not shown, and is set at a predetermined temperature $T_1$, for example. The wafer W is cooled for a predetermined time on the wafer cooling stage 39. Then, the wafer W, which has been cooled to about the temperature $T_1$, is transferred to the processing chamber 1b and placed on the processing stage 2b by the vacuum-side transfer apparatus 31 (path $P_9$ in FIG. 6) (a step of second transfer). However, when the wafer W taken out from the wafer cassette CR has a sufficiently low temperature, the initial transfer of the wafer W to the wafer cooling stage 39 ($P_8$ in FIG. 6) and the cooling of the wafer W thereon can be omitted, and the wafer W may be transferred from the load-lock chamber 5a directly to the processing chamber 1b.

Since a cooling gas is introduced from the showerhead 20 to the processing chamber 1b, and a heat of the processing stage 2b is moved to the wafer W placed on the processing stage 2b, lowering of temperature of the processing stage 2b is promoted.

After a predetermined time has passed, the wafer W in the processing chamber 1b is again transferred to the wafer cooling stage 39 of the transfer chamber 3 (path $P_{10}$ in FIG. 6) (a step of first transfer). The wafer W, which is warmed by absorbing the heat of the processing stage 2b of the processing chamber 1b, is cooled to about the temperature $T_1$ by the wafer cooling stage 39.

In the method of lowering a substrate table in this embodiment, by repeating plural times the transfer of the wafer W along the path $P_9$ and the transfer of the wafer W along the path $P_{10}$, which are one cycle, a temperature lowering rate of the processing stage 2b of the processing chamber 1b can be increased. Since the temperature of the processing stage 2b can be measured in real time by the thermocouple 14, the cycle is repeated for the required number of times until the temperature of the processing stage 2b reaches a predetermined temperature.

After the temperature of the processing stage 2b has been lowered to the predetermined temperature, the wafer W is returned from the wafer cooling stage 39 to the load-lock chamber 5a by the vacuum-side transfer apparatus 31 in accordance with a procedure reverse to the above (path $P_{11}$ in FIG. 6). Further, the wafer W is returned from the load-lock chamber 5a to the wafer cassette CR by the atmospheric-side transfer apparatus 51 ($P_{12}$ in FIG. 6), whereby the temperature lowering process to the processing stage 2b is finished. In the final cycle, the path $P_{10}$ and the path $P_{11}$ may be consolidated such that the wafer W is transferred from the processing stage 2b directly to the waiting stage 6a in the load-lock chamber 5a without passing through the wafer cooling stage 39.

In this embodiment, the wafer cooling stage 39 is disposed in the transfer chamber 3, and the transfers of a wafer W between the wafer cooling stage 39 and the processing chamber 1b are alternately repeated. Thus, as compared with the case where the transfers of a wafer between the load-lock chamber 5a and the processing chamber 1b is alternately repeated, the transfer distance is shorter so that the time required for the transfers can be reduced, resulting in improvement in throughput. Thus, the time required for lowering a temperature of the processing stage 2b can be reduced. Other structures, functions and effects in this embodiment are the same as those of the first embodiment.

Third Example

Next, the method of lowering a temperature of a stage in a third embodiment of the present invention is described with reference to FIG. 7. In this embodiment, a cooling chamber (substrate cooling chamber) 1e, which is exclusively used for cooling a wafer W, is disposed adjacently to the transfer chamber 3, and a wafer cooling stage 2e as the "second substrate table" is disposed in the cooling chamber 1e. The procedure is described below.

Figure 7:
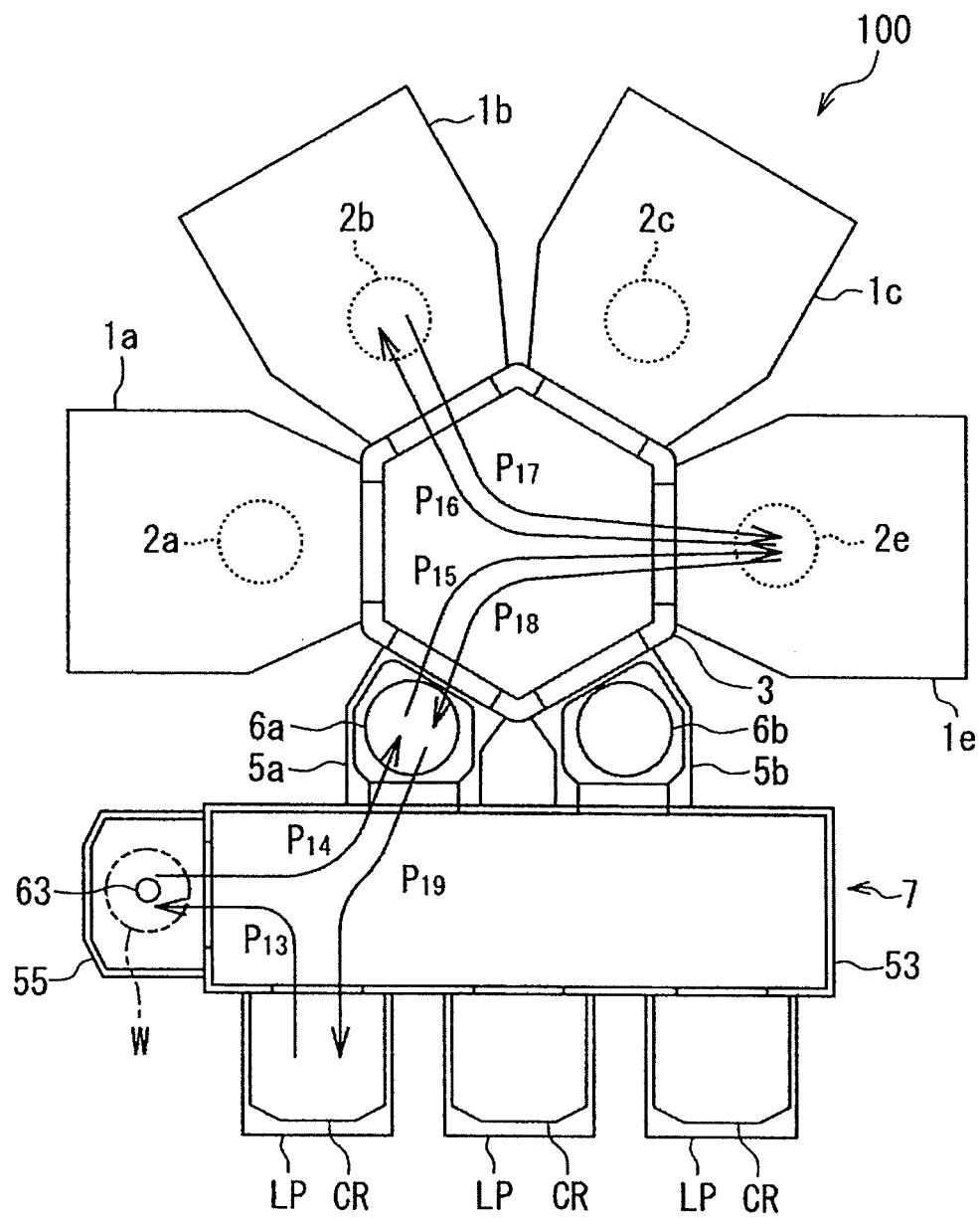
FIG. 7 is an explanatory view showing a transfer path of a wafer in a third embodiment.

At first, one wafer W to be used for the temperature lowering process is taken out from the wafer cassette CR by the atmospheric-side transfer apparatus 51, and is oriented by the orienter 55, thereafter, the wafer W is loaded into the load-lock chamber 5a and placed on the waiting stage 6a, for example, (paths $P_{13}$ and $P_{14}$ in FIG. 7).

Then, the wafer W is transferred from the load-lock chamber 5a to the wafer cooling stage 2e in the cooling chamber 1e by the vacuum-side transfer apparatus 31 ($P_{15}$ in FIG. 7). Although not shown, the cooling chamber 1e is equipped with a cooling-gas supply mechanism, and the wafer cooling stage 2e is equipped with a chiller mechanism. A temperature of the wafer cooling stage 2e is set at, e.g., a temperature $T_1$, by a cooling gas introduced into the cooling chamber 1e and the chiller mechanism. Thus, the wafer W is cooled on the wafer cooling stage 2e for a predetermined time. Then, the wafer W having been cooled to about the temperature $T_1$ is transferred to the processing chamber 1b and placed on the processing stage 2b (path $P_{16}$ in FIG. 7) (a step of second transfer). However, when the wafer W taken out from the wafer cassette CR has a sufficiently low temperature, the initial transfer of the wafer W to the wafer cooling stage 2e ($P_{15}$ in FIG. 7) and the cooling of the wafer W thereon can be omitted, and the wafer W may be transferred from the load-lock chamber 5a directly to the processing chamber 1b.

Since a cooling gas is introduced from the showerhead 20 into the processing chamber 1b, and a heat of the processing stage 2b is moved to the wafer W placed on the processing stage 2b, lowering of temperature of the processing stage 2b is promoted.

After a predetermined time has passed, the wafer W in the processing chamber 1b is transferred again to the wafer cooling stage 2e in the cooling chamber 1e (path $P_{17}$ in FIG. 7) (a step of first transfer). The wafer W, which is warmed by absorbing the heat of the processing stage 2b of the processing chamber 1b, is cooled to about the temperature $T_1$ by the wafer cooling stage 2e.

In the method of lowering a temperature of a table in this embodiment, by repeating plural times the transfer of the wafer W along the path $P_{16}$ and the transfer of the wafer W along the path $P_{17}$, which are one cycle, a temperature lowering rate of the processing stage 2b of the processing chamber 1b can be increased. Since the temperature of the processing stage 2b can be measured in real time by the thermocouple 14, the cycle is repeated for the required number of times until the temperature of the processing stage 2b reaches a predetermined temperature.

After the temperature of the processing stage 2b has been lowered to the predetermined temperature, the wafer W is returned from the wafer cooling stage 2e in the cooling chamber 1e to the load-lock chamber 5a by the vacuum-side transfer apparatus 31 in accordance with a procedure reverse to the above (path $P_{18}$ in FIG. 7). Further, the wafer W is returned from the load-lock chamber 5a to the wafer cassette CR by the atmospheric-side transfer apparatus 51 ($P_{19}$ in FIG. 7), whereby the temperature lowering process to the processing stage 2b is finished. In the final cycle, the path $P_{17}$ and the path $P_{18}$ may be consolidated such that the wafer W is transferred from the processing stage 2b directly to waiting stage 6a in the load-lock chamber 5a without passing through the wafer cooling stage 2e.

In this embodiment, the cooling chamber 1e exclusively used for the temperature lowering process is adjacently disposed on the transfer chamber 3, and the transfers of a wafer W between the wafer cooling stage 2e, which is disposed in the cooling chamber 1e, and the processing stage 2b, which is disposed in the processing chamber 1b, are alternately repeated. Thus, as compared with the case where the transfer of a wafer between the load-lock chamber 5a and the processing chamber 1b are alternately repeated, the transfer distance is shorter so that the time required for the transfer can be reduced, resulting in improvement in throughput. In addition, by using the exclusive cooling chamber 1e equipped with the cooling-gas supply mechanism, a cooling effect of a wafer W can be improved. Thus, the time required for lowering a temperature of the processing stage can be reduced. Other structures, functions and effects in this embodiment are the same as those of the first embodiment.

Example

Figure 8:
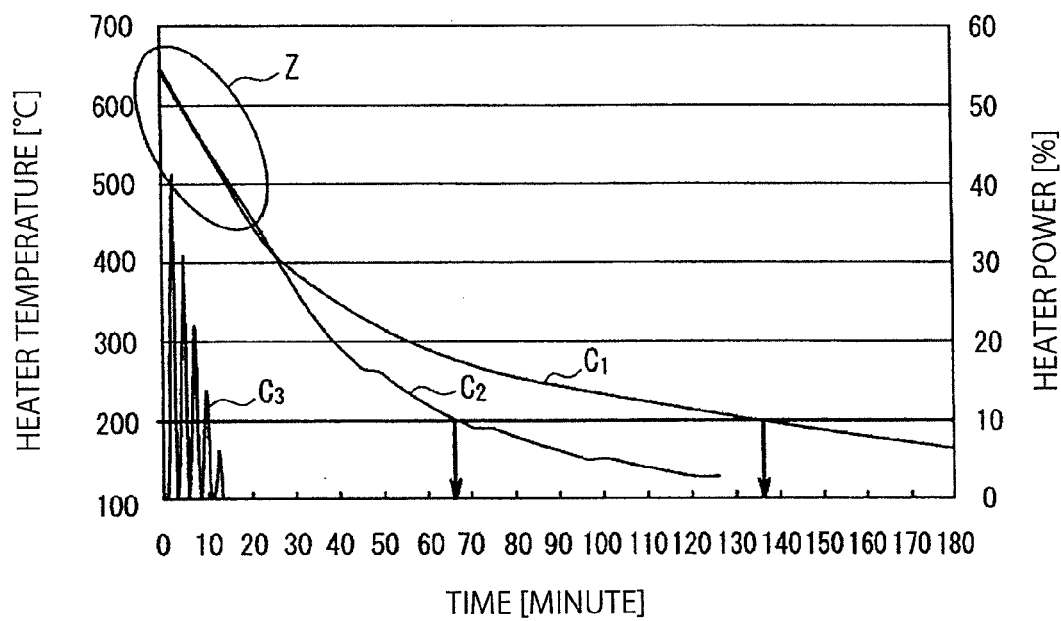
FIG. 8 is a graph showing a temperature change in a table in an example.

Next, data of an experiment conducted for confirming the effect of the present invention are described. When a temperature of a table in a processing chamber of a substrate processing system 100 having the same structure as that shown in FIG. 1 was lowered from 650° C. to 200° C. or less, a temperature lowering time when the temperature lowering method of the present invention was used and a temperature lowering time when the temperature lowering method of the present invention was not used are compared to each other. FIG. 8 is a graph showing a measuring result of a temperature change of the table which was subjected to the temperature lowering process. In FIG. 8, the axis of ordinate shows a heater temperature or a heater power, and the axis of abscissa shows an elapsed time from when the temperature lowering process is stated. In FIG. 8, the curve $C_1$ shows a result of the comparative example which did not use the present method, and the curve $C_2$ shows a result of the example which used the present method. The curve $C_3$ shows a change of power of a resistance heater embedded in the table.

In this experiment, in a section Z from 650° C. to 450° C., which is an initial temperature lowering phase, a temperature lowering rate was controlled to be 10° C./minute by monitoring the temperature of the table by means of a thermocouple, with a resistance-heater power source of the table being on. The reason for controlling the temperature lowering rate is to prevent the table from being thermally damaged such as distorted, by a sudden temperature lowering. On the other hand, in a temperature lowering phase not more than 450° C., the resistance heater power source was off. In this case, since the sudden temperature lowering in the initial temperature lowering phase (section Z) rarely occurs. Thus, in the natural temperature lowering, the temperature lowering rate was decreased (curve $C_1$ in FIG. 8). Thus, in the temperature lowering phase not more than 450° C., the method of lowering a temperature of a table in the first embodiment (steps S1 to S4 in FIG. 3) was carried out. A cooling medium whose temperature had been adjusted at 20° C. by the chiller mechanism 42 was circulated at a flow rate of 2 L/min through the flow channel 41 formed in the waiting stage 6a in the load-lock chamber 5a. As compared with the temperature lowering rate in the natural temperature lowering, the temperature lowering rate was increased, whereby the temperature could be lowered for a shorter period (curve $C_2$ in FIG. 8). In this experiment, total times required for lowering the temperature from 650° C. to 200° C. were 137 minutes in the curve $C_1$ and 67 minutes in the curve $C_2$. Thus, it was confirmed that, by performing the temperature lowering method with the use of a wafer W, the temperature lowering time can be significantly reduced. The aforementioned initial temperature lowering phase (section Z) is a step of first lowering temperature in which a temperature of the table (first substrate table) in the processing chamber is lowered at a rate that is controlled to be constant. In addition, the aforementioned temperature lowering phase not more than 450° C. is a step of second lowering temperature in which the temperature of the table is naturally lowered.

Although the embodiments of the present invention have been described, the present invention is not limited thereto and can be variously modified. For example, in the above embodiments, the substrate processing system 100 including the four processing chambers adjacent to the vacuum-side transfer chamber is described by way of example. However, the present invention can be applied to a substrate processing system including a cluster tool of different structure or a single processing apparatus.

The present invention can be applied to a substrate processing system configured to process a large glass substrate or ceramic substrate to be used in a liquid-crystal display or an organic EL display.

The second substrate table is preferably equipped with a chiller mechanism or a cooling mechanism formed of, e.g., Peltier elements. However, the chiller mechanism and the cooling mechanism are dispensable.

The invention claimed is:
1. A method of lowering a temperature of a substrate table in a semiconductor substrate processing system including:
a first substrate table provided with a heating mechanism for heating a semiconductor substrate; a processing chamber in which the first substrate table is disposed, the processing chamber being configured to perform a predetermined process with the substrate being placed on the first substrate table; a temperature sensor configured to determine a temperature of the first substrate table; a substrate transfer apparatus configured to transfer the substrate to the processing chamber; a transfer chamber in which the substrate transfer apparatus is disposed; a second substrate table configured to cool the substrate; and a controller configured to control the semiconductor substrate processing system;
the method of lowering a temperature of a substrate table comprising the steps of:
determining a temperature of the first substrate table by use of the temperature sensor;
a first transfer controlled by the controller in which the substrate placed on the first substrate table and heated by the first substrate table to a substrate temperature is transferred to and placed on the second substrate table by the substrate transfer apparatus;
a second transfer controlled by the controller in which the substrate placed on the second substrate table and cooled to another substrate temperature by the second substrate table is transferred to and placed on the first substrate table by the substrate transfer apparatus; and
repeating the step of first transfer, the step of second transfer, and the temperature determining step until the temperature of the first substrate table is lowered to a predetermined temperature by transferring heat from the first substrate table to the substrate.
2. The method of lowering a temperature of a substrate table according to claim 1, wherein the substrate placed on the second substrate table is cooled by a cooling mechanism provided with the second substrate table.

3. The method of lowering a temperature of a substrate table according to claim 1, wherein
the substrate processing system further includes a load-lock chamber as a vacuum preparation chamber, in which a table is disposed, the load-lock chamber being disposed adjacently to the transfer chamber, and
the table in the load-lock chamber serves also as the second substrate table.

4. The method of lowering a temperature of a substrate table according to claim 1, wherein
the second substrate table is disposed in the transfer chamber.

5. The method of lowering a temperature of a substrate table according to claim 1, wherein
the substrate processing system further includes a substrate cooling chamber for cooling the substrate, and
the second substrate table is disposed in the substrate cooling chamber.

6. The method of lowering a temperature of a substrate table according to claim 1, further comprising the steps of:
first lowering the temperature of the first substrate table to within a predetermined temperature zone at a rate that is controlled to be constant; and
second lowering the temperature of the first substrate table naturally to within a temperature zone that is lower than the predetermined temperature zone;
wherein the first transfer and the second transfer are performed only during the second lowering.

7. The method of lowering a temperature of a substrate table according to claim 1, wherein
the first transfer and the second transfer are performed when the processing chamber and the transfer chamber are under vacuum.

8. The method of lowering a temperature of a substrate table according to claim 1, wherein
the substrate is an exclusive temperature lowering substrate having a heat release structure with a plurality of ridges on an upper surface of the substrate.

9. A computer-readable storage medium storing a control program executable on a computer,
the control program being configured to control a semiconductor substrate processing system so as to carry out a method of lowering a temperature of a substrate table by the computer, the substrate processing system including: a first substrate table provided with a heating mechanism for heating a semiconductor substrate; a processing chamber in which the first substrate table is disposed, the processing chamber being configured to perform a predetermined process with the substrate being placed on the first substrate table; a temperature sensor configured to determine a temperature of the first substrate table; a substrate transfer apparatus configured to transfer the substrate to the processing chamber; a transfer chamber in which the substrate transfer apparatus is disposed; a second substrate table configured to cool the substrate; and a controller configured to control the semiconductor substrate processing system,
the method of lowering a temperature of a substrate table comprising the steps of:
determining a temperature of the first substrate table by use of the temperature sensor,
a first transfer controlled by the controller in which the substrate placed on the first substrate table is transferred to the second substrate table by the substrate transfer apparatus;
a second transfer controlled by the controller in which the substrate placed on the second substrate table and cooled to another substrate temperature by the second substrate table is transferred to and placed on the first substrate table by the substrate transfer apparatus; and
repeating the step of first transfer, the step of second transfer, and the determining step until the temperature of the first substrate table is lowered to a predetermined temperature by transferring heat from the first substrate table to the substrate.

10. A semiconductor substrate processing system comprising:
a first substrate table provided with a heating mechanism for heating a semiconductor substrate;
at least one processing chamber in which the first substrate table is disposed, the processing chamber being configured to perform a predetermined process with the substrate being placed on the first substrate table;
a temperature sensor configured to determine a temperature of the first substrate table;
a substrate transfer apparatus configured to transfer the substrate to the processing chamber;
a transfer chamber in which the substrate transfer apparatus is disposed;
a second substrate table configured to cool the substrate; and
a controller configured to control the semiconductor substrate processing system, the controller:
determining a temperature of the first substrate table by use of the temperature sensor,
causing a first transfer in which the substrate placed on the first substrate table and heated by the first substrate table to a substrate temperature is transferred to and placed on the second substrate table by the substrate transfer apparatus,
causing a second transfer in which the substrate placed on the second substrate table and cooled to another substrate temperature by the second substrate table is transferred to and placed on the first substrate table by the substrate transfer apparatus, and
causing the first transfer, the second transfer, and the temperature determining to be repeated until the temperature of the first substrate table is lowered to a predetermined temperature by transferring heat from the first substrate table to the substrate.

11. The substrate processing system according to claim 10, further comprising a cooling mechanism provided with the second substrate table, the cooling mechanism being configured to cool the substrate.

12. The substrate processing system according to claim 10, further comprising a load-lock chamber as a vacuum preparation chamber, in which a table is disposed, the load-lock chamber being disposed adjacently to the transfer chamber,
wherein the table in the load-lock chamber serves also as the second substrate table.

13. The substrate processing system according to claim 10, wherein
the second substrate table is disposed in the transfer chamber.

14. The substrate processing system according to claim 10, further comprising a substrate cooling chamber for cooling the substrate,
wherein the second substrate table is disposed in the substrate cooling chamber.

15. The substrate processing system according to claim 10, wherein
the substrate is an exclusive temperature lowering substrate having a heat release structure with a plurality of ridges on an upper surface of the substrate.

* * * * *